United States Patent [19]

Rozman et al.

[11] Patent Number: 4,843,311

[45] Date of Patent: Jun. 27, 1989

[54] WATTMETER COMPRISING A HALL SENSOR AND AN A/D CONVERTER

[75] Inventors: Miro Rozman, Bled; Silvo Zlebir, Cerklje, both of Yugoslavia

[73] Assignee: Iskra-Sozd Elektrokovinske Industrije n .sol.o., Ljubljana, Yugoslavia

[21] Appl. No.: 73,477

[22] Filed: Jul. 15, 1987

[30] Foreign Application Priority Data

Jul. 15, 1986 [YU] Yugoslavia ............................ 1257/86

[51] Int. Cl.$^4$ ........................ G01R 21/08; G01R 1/02
[52] U.S. Cl. ............................... 324/142; 324/117 H; 324/103 R
[58] Field of Search ................... 324/142, 117 H, 127, 324/103 R, 111, 251, 252; 364/483, 492

[56] References Cited

U.S. PATENT DOCUMENTS

| | | | |
|---|---|---|---|
| 4,066,960 | 1/1978 | Milkovic | 324/142 X |
| 4,327,416 | 4/1982 | Jerrim | 324/117 H |
| 4,371,837 | 2/1983 | Sieverin | 324/251 X |
| 4,514,685 | 4/1985 | Gilker | 324/142 X |
| 4,639,665 | 1/1987 | Gary | 324/117 H |

FOREIGN PATENT DOCUMENTS 3001772 7/1981 Fed. Rep. of Germany .
57-121288 7/1982 Japan .

Primary Examiner—Reinhard J. Eisenzopf
Assistant Examiner—Vinh Nguyen
Attorney, Agent, or Firm—Fleit, Jacobson, Cohn & Price

[57] ABSTRACT

A wattmeter in which a Hall sensor is provided with a large number of Hall elements, whose voltages are individually tapped. The wattmeter circuit is further provided with an impulse-width modulator, the input voltage of this modulator being periodically reversed, with a feedback to compensate the disturbing voltages, and with a circuit for precision curvature compensation CMOS bandgap reference. The output of an embodiment of the wattmeter is adapted to the reading-off by a computer. A wattmeter can be realized on a semiconductor wafer.

13 Claims, 6 Drawing Sheets ance with the foregoing background discussion, the object of this invention is to compensate disturbing influences as e.g. the temperature Hall voltage variation, linear or quadratic, the voltage originating

WATTMETER COMPRISING A HALL SENSOR AND AN A/D CONVERTER

TECHNICAL FIELD

The invention relates to a wattmeter comprising a Hall sensor and an A/D converter, in which wattmeter said Hall sensor is used as a current transformer as well as a multiplier, and a circuit for the compensation of a temperature drift and of disturbing voltages generated in the sensor itself as well as of disturbing signals, especially of the offset voltage of the circuit, are comprised.

The invention belongs to the field of electric power measurements with devices using a galvanomagnetic effect, more precisely a Hall effect. The pertinent IPC designation is G 01 R 21/08. The invention also relates to the Hall sensor itself (H 01 L 43/06). The proposed solution of the object of the invention is feasible in integrated circuit technology (H 01 L 27/22).

BACKGROUND OF THE INVENTION

In recent years semiconductor Hall elements have been used for electronic measurements of electric power. The feeding current is proportional to the mains voltage and the magnetic induction is proportional to the mains current, hence the Hall voltage is proportional to the power. The Hall voltage expression is:

$$U_H = K(T) \cdot I_N \cdot B = K(T) \cdot k_1 U \cdot k_2 I$$

with the following meanings of the designations: Hall voltage $U_H$, feeding current $I_N$, magnetic induction B, temperature dependent Hall coefficient $K(T)$, mains voltage U, mains current I, and conversion coefficients $k_1$, $k_2$.

Because of the temperature dependent coefficient $K(T)$ the Hall sensor as such is not appropriate for application in wattmeters for which high-accuracy performance in a broad temperature interval is required.

There are known various methods of temperature compensation, mostly using thermistors. A thermistor series-connection to the Hall element is described in the Japanese patent JP 57 121288. A deficiency of this compensation method is that the thermistor temperature dependence is different from the one of the Hall element, for which reason an exact compensation can hardly be accomplished.

Further, the temperature dependence of the Hall voltage is compensated with a separate measuring circuit, in which the temperature is sensed by a thermistor and a correction voltage is generated, which is added to the Hall voltage (U.S. Pat. No. 4,327,416). This is a demanding and expensive system since two separate measuring circuits and a large capacity storage unit are required.

The actual Hall element output voltage is very low, often below the level of disturbing voltages such as the Hall voltage originating from feeding current induction or from the quadratic term in K(T). With known voltage-frequency converters and A/D converters no signals with a level below the level of disturbing voltages can be measured.

It has not been possible to make high-accuracy wattmeters comprising Hall elements because of an asymmetric geometry and of a piezoresistive effect of Hall elements. By these two disturbing influences an alternating component is generated following the feeding current behaviour. In known wattmeters (e.g. JP No. 58 154263 and DE No. 30 01 772) this disturbing voltage is reduced by a special geometric disposition of differently oriented Hall elements within the Hall sensor. Voltage terminals of Hall elements are either series- or parallel-interconnected. The disturbing voltage is reduced, yet the interconnected sensor elements influence each other. On the other hand, there is known a circuit, in which to separately tapped voltages of particular elements (patent DE No. 30 26 226) offset voltages of differential transistor circuits are superposed.

SUMMARY OF THE INVENTION

In accordance with the foregoing background discussion, the object of this invention is to compensate disturbing influences as e.g. the temperature Hall voltage variation, linear or quadratic, the voltage originating from feeding current induction, the piezoresistive effect and the asymmetric geometry of particular Hall elements, whereat the complete wattmeter circuit should be capable of being produced as a single integrated circuit and should comply with the technical requirements made on such meters.

With the foregoing objects in view, the wattmeter according to the invention is characterized by features of the characterizing portion of the first claim. Further embodiments of the invention are evident from the dependent claims.

Specific embodiments of the invention will be presented in the following detailed description in conjunction with the accompanying drawings.

DETAILED DESCRIPTION

The compensation of disturbing voltages is based on dividing a measuring period into two equal time intervals. By measuring the input voltage directly in the first time interval ($t_0$, $t_1$) and with a reversed sign in the second time interval ($t_1$, $t_2$), the useful and the disturbing signal are added and subtracted, respectively, giving a value made free of any disturbing signal at the end of the period. The sign of the Hall voltage is reversed by a sensor circuit 1, 1' by interchanging the feeding terminals of the sensor Hall elements.

Figure 1:
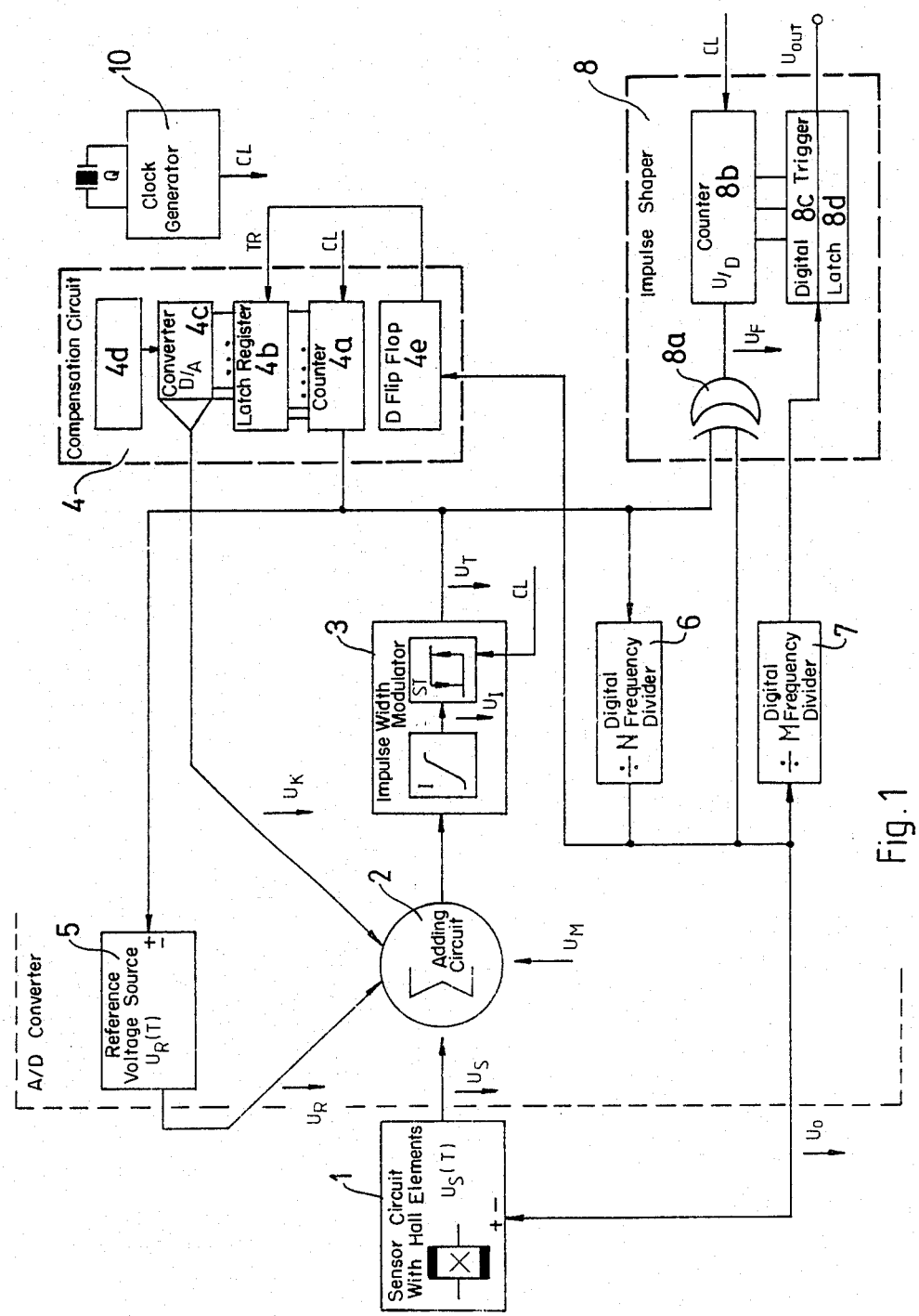
FIG. 1 is a block diagram of the meter according to the invention.
Figure 3A:
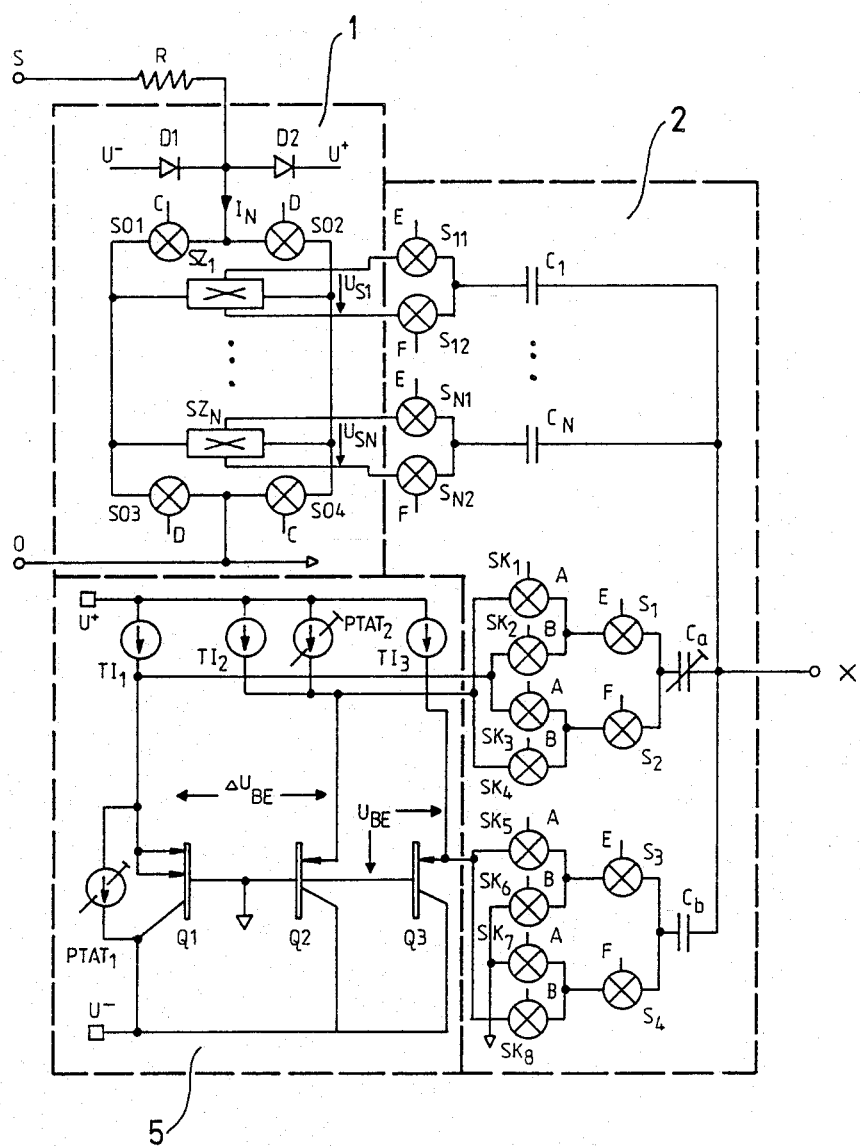
FIGS. 3a—3e show a circuit of the meter according to the invention.
Figure 3B:
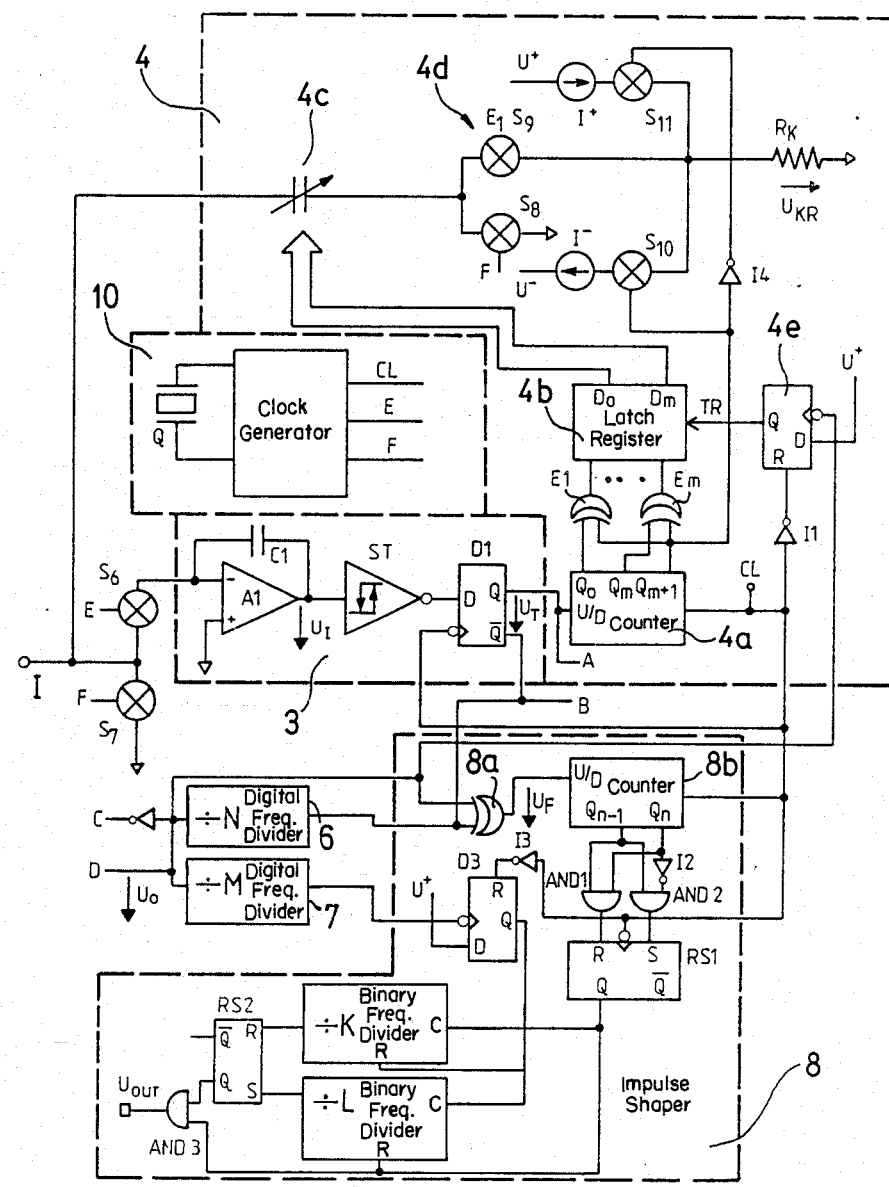

By the block diagram in FIG. 1 and the meter circuit in FIGS. 3a, b, c, d, e, a basic wattmeter embodiment of the invention is represented. The A/D converter of FIG. 1 is shown to comprise all of the elements except sensor circuit.

The Hall sensor voltage $U_S$ is generated in an adding circuit 2 by adding up voltages $U_{S1}, \ldots U_{SN}$ of the Hall elements $SZ_1, \ldots SZ_N$, a reference voltage $U_R$, and a compensation voltage $U_K$ by which a disturbing voltage $U_M$ is compensated. The voltage $U_S$ is applied to an impulse-width modulator 3, where it is integrated by an integrator I. When the output voltage $U_I$ of the integrator I reaches the switching level $U_H^\pm$ of a comparator circuit ST, the sign of the output voltage $U_T$ of this circuit is changed. Therefore the integrator voltage $U_I$ is limited by the switching levels $U_H^\pm$. In the switching moment the polarity of the reference voltage $U_R$ is changed so that the output voltage $U_I$ of the integrator I moves around zero potential. The frequency of the voltage $U_T$ at the output of the modulator 3 is divided by a digital frequency divider 6 with a division ratio N. By divider 6 the output voltage, which is synchronous with a signal $U_o$, the sign of the feeding current in the Hall elements $SZ_1, \ldots SZ_N$ is changed.

When the voltage $U_S$ is different from zero, the fall and rise slope of the voltage $U_I$ differ; for this reason the durations of the differently signed impulses in the impulse train $U_T$ are different. The train $U_T$ in the time interval $t_1$, $t_2$ is inverted with respect to the train $U_T$ in the interval $t_0$, $t_1$ (FIG. 2), which is a consequence of a change of the polarity of the voltage $U_S$ in the moment $t_1$.

An impulse train $U_F$ is generated at the output of an exclusive OR gate 8a in an impulse shaper 8. The ratio of the durations of differently signed impulses within the train $U_F$ is constant. By the train $U_F$ the counting direction (adding, subtracting) of a counter 8b counting impulses CL of a clock generator is determined. The content of this counter increases with an increasing modulation factor, i.e. the ratio of the durations of differently signed impulses within the train $U_F$. A digital trigger 8a forms a frequency signal from the numerical counter content. This signal is conducted through a latch 8d to the output $U_{OUT}$ when its frequency is higher than the frequency of the signal from a digital frequency divider 7 with a division ratio M.

The appearance of a DC disturbing voltage $U_M$ is the reason why the durations of the differently signed impulses are different also when the input voltage $U_S$ is zero. This fact is used for the compensation of this disturbing voltage. A counter 4a, whose counting direction is determined by the voltage $U_T$, will have a content in the moment $t_1$ different from the content in the moment $t_2$, if the disturbing voltage $U_M$ is present; this represents a measure of the level of the disturbing voltage $U_M$. At each transition of the signal $U_o$ from the state 1 to the state 0 the content of the counter 4a is stored in a latch register 4b, whose output is connected to the digital input of a D/A converter 4c. The converter 4c generates the compensation voltage $U_K$ in dependence on the state of the latch 4b. The content $c_{4a}$ of the counter 4a will increase until the disturbing voltage $U_M$ is compensated by the voltage $U_K$.

Figure 2:
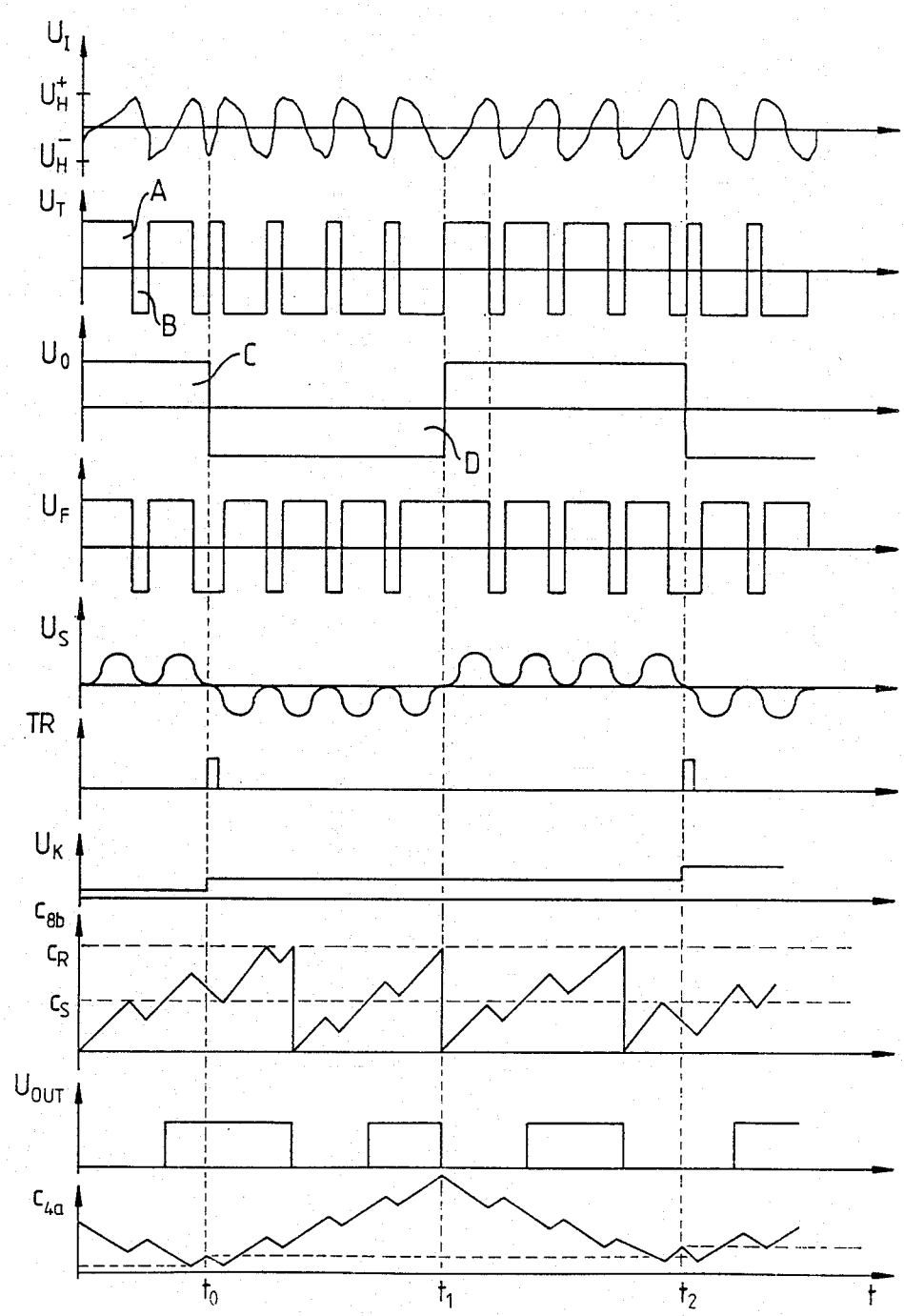
FIG. 2 is the time behaviour of appearing signals.

In FIG. 2 there are also shown:

a signal TR which triggers the transfer of the binary content $c_{4a}$ in the latch register 4b at each change of the signal $U_o$ from the state 1 to the state 0;

the compensation voltage $U_K$ at the output of the D/A converter 4c, this voltage $U_K$ being proportional to the content $c_{4a}$ of the counter 4a;

the content $c_{8b}$ of the counter 8b, being reset when a maximal value is reached;

the output signal $U_{OUT}$ of the digital trigger 8c; the trigger 8c is set into the state 1 when the content $c_{8b}$ for the first time reaches a half value $C_S$, and is returned into the state 0 when the content $c_{8b}$ reaches its maximum $C_R$;

the content $c_{4a}$ which at the moment of the transfer represents a measure of the level of the disturbing voltage $U_M$.

The temperature compensation is accomplished by an approximation of the temperature dependence of the Hall voltage $U_S(T)$ by the temperature dependence of the voltage $U_R(T)$ of a CMOS bandgap. In this way it is tried to reach the temperature independence of the ratio $U_S(T)/U_R(T)$. The precision curvature compensation CMOS bandgap reference is used (B.-S. Song, P. R. Gray, IEEE Journal of Solid-State Circuits, 634–648, 18 (1983)), approximating the voltage $U_S(T)$ linearly and quadratically.

A sensor circuit 1 is provided with controlled CMOS switches $SO_1, \ldots SO_4$ (FIG. 3) interconnected into a bridge. The sign of the feeding current $I_N$ is controlled by the signals C, D, opposite in phase and obtained from the frequency divider 6. The frequency input terminal of the current $I_N$ enters the bridge from the mains phase terminal S (through a resistor R) and flows through the second input terminal of the bridge back to the mass-connected mains zero terminal 0. The Hall elements $SZ_1, \ldots SZ_N$ are connected in parallel to the output diagonal of the bridge. Diodes $D_1$, $D_2$ protect against an over-voltage.

A reference voltage source 4 applies a base-emitter voltage $U_{BE}$ of a transistor Q3 and a voltage $\Delta U_{BE}$, i.e. the difference of base-emitter voltages of transistors Q1, Q2. The emitter area of the transistor Q1 is A-times the emitter area of the transistor Q2. The emitter current of the transistor Q1 is the difference of the currents from a temperature independent current source $TI_1$ and a current source $PTAT_1$, whose current is proportional to temperature. The emitter current of the transistor Q2 is a sum of currents from sources $TI_2$ and $PTAT_2$. By the ratio of the currents from $TI_2$ and $PTAT_2$ a quadratic term in the temperature dependence is determined. Therefore by changing the currents from $PTAT_1$, $PTAT_2$ the temperature dependence of the reference voltage $U_R(T)$ can be set at will. The transistor Q3 is fed from a temperature independent current source $TI_3$. The reference voltage $U_R(T)$ is set by capacitors $C_a$, $C_b$ and is given by the following expression:

$$U_R(T) = U_{BE} + \frac{C_a}{C_b} \cdot \Delta U_{BE}. \tag{1}$$

The adding circuit 2, made as a switching capacitor circuit, tapes the Hall element voltages by the capacitors $C_1, \ldots C_N$, the reference voltages $U_R$ by the capacitors $C_a$, $C_b$, and the compensation voltage $U_K$ by the capacity of the D/A converter 4c. The electronic switches are controlled by non-overlapping reversing signals E, F (FIG. 4e). The total charge fed into the modulator 3 by the capacitors $C_1, \ldots C_N$, $C_a$, $C_b$ and 4c at a single switching of the switches $S_{11}, \ldots S_{N2}$ is $$Q_S = \sum_{i=1}^{N} C_i U_{si} + C_b \left( U_{BE} + \frac{C_a}{C_b} \cdot \Delta U_{BE} \right) + C_K U_K. \tag{2}$$

A linear temperature dependence is set by the capacity ratio of the capacitors $C_a$, $C_b$.

A rhythmic reversing of the reference voltage polarity is performed by changing the polarity of the voltages $U_{BE}$, $\Delta U_{BE}$ with a switching commutator, which is provided with switches $S_{K1}, \ldots S_{K8}$. Said switches are controlled by the output signals A, B of the modulator 3.

The impulse-width modulator 3 is provided at its input side with an integrator I comprising an operational amplifier $A_1$ with a backcoupling capacitor C1. The integrator output voltage $U_I$ is brought to the input of the comparator circuit ST, which reverses its output voltage at the threshold voltages $U_H^{\pm}$. A synchronization with clock impulses CL is performed by a flip-flop D1, which at the transitions of the impulse CL from 0 to 1 transfers the state of the comparator circuit ST to the output Q of the flip-flop D1, representing the modulator 3 output. The inverted signal is generated at at the output $\bar{Q}$ of the flip-flop D1.

The impulse shaper 8 transforms the impulse-width modulated signal into the output signal $U_{OUT}$, the frequency of which is proportional to the measured electric power. The influence of the reversing of the signal $U_I$ polarity is removed by an exclusive OR gate 8a. The first input of the gate 8a is connected to the Q output of the modulator 3, the second one, however, is connected to the output of the digital frequency divider 6. By the obtained signal $U_F$ the counting direction of the up-/down counter 8a, by which the impulses CL are counted, is determined. The counter content is increased depending on the modulation factor of the signal $U_F$. Said content can be transferred to a computer and is a measure of the measured energy. When the output signal of the counter is needed in the form of impulses, a digital trigger 8c, provided with gates AND1, AND2 and an RS cell, is connected to the outputs $Q_n$, $Q_{n-1}$ of the counter 8b. When the counter content reaches the half value for the first time, the output of the cell RS1 is changed to the state 1; this is kept to the moment when the maximum counter content is reached, whereafter the cell output is returned to the state 0. The signal at the output Q of the cell RS1 is compared to the signal at the output of the divider 7, whose frequency is the frequency of the modulator 3 divided by M. By a flip-flop D3 it is transformed into impulses with a width equal to that of the impulse CL and with a frequency equal to that of the signal at the divider 6 output.

The latch 8d consists of two binary frequency dividers K, L with division ratios K and L, respectively. To the counting input C of the divider K the output signal of the counter 8b is conducted, to the reset input R, however, the reference signal from the flip-flop D3 is conducted. At the divider L both said signals are interchanged. The outputs of the dividers K, L are connected to the input R and S, respectively, of the cell RS2. The output signal $U_{OUT}$ is transmitted by a logic gate AND3 only when its frequency is higher than the frequencies set by the frequency dividers M, K, L.

Figure 3C:
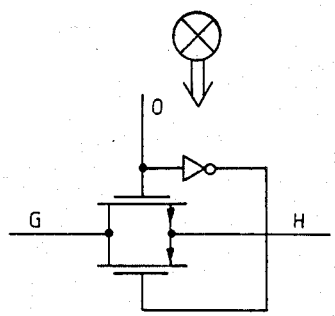
Figure 3D:
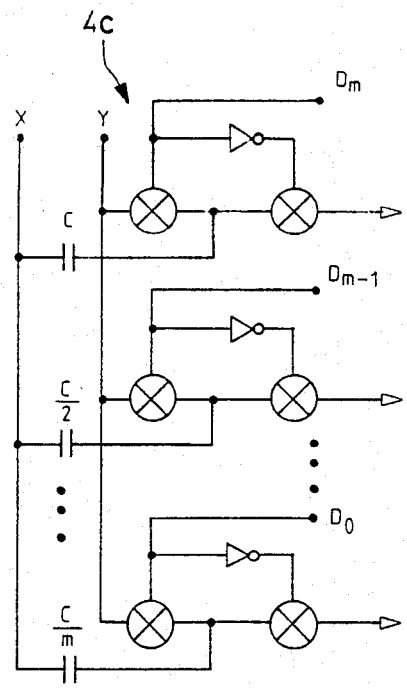

By the compensation circuit 4 with the counter 4a, whose direction of counting the impulses CL is determined by the modulator 3 output voltage $U_T$, the presence of a DC disturbing voltage in the measuring signal is detected. As long as the disturbing voltage is not compensated by the voltage $U_K$ from the D/A converter 4c, the content $c_{4a}$ of the counter 4a at the moment $t_2$ differs from the one at the moment $t_o$. This difference is therefore a sign of a non-compensated disturbing voltage presence. For this reason at each end period of the polarity reversal of the input signal a new content of the counter 4a is transferred to the latch register 4b through exclusive OR gates E1, ... En. An order signal TR for the transfer of the content $c_{4a}$ into the latch register 4b is generated by a D flip-flop 4e D2 by forming the impulse CL on its output Q whenever the signal D changes from 1 to 0. At the negative polarity of the disturbing voltage the content of the counter 4a is lowered. Therefore the output Qm+1 takes the state 1 and, as a consequence thereof, the outputs $Q_o$, ... Qm are inverted by gates E1, ... Em, respectively. The binary signal D value in the digital latch register 4b is determined by the capacity $C_K$ of the circuit 4c representing together with switches $S_8$, $S_9$ a feedback for the compensation of the disturbing voltage. The circuit 4c is represented in FIG. 3d. The level of the compensation voltage $U_K$ of the reference voltage source 4d is determined by a resistor $R_K$ and by current sources $I^+$, $I^-$, and the polarity of the voltage $U_K$ is determined by switches $S_{10}$, $S_{11}$, controlled by the output of the counter 4a.

Figure 3E:
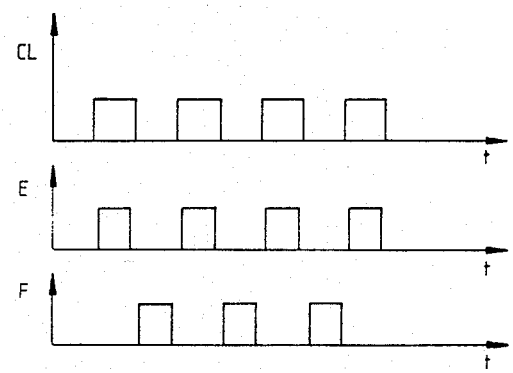

A clock generator 10 is provided with a crystal oscillator Q. Its clock impulses CL provide a time base synchronizing the digital logic. Non-overlapping signals E, F controlling the CMOS switches are formed by the impulses CL. The time behaviour of the signals E, F is represented in FIG. 3e. An equivalent circuit for the controlled CMOS switch with a control terminal O and with connecting terminals G, H is shown in FIG. 3c.

Figure 4:
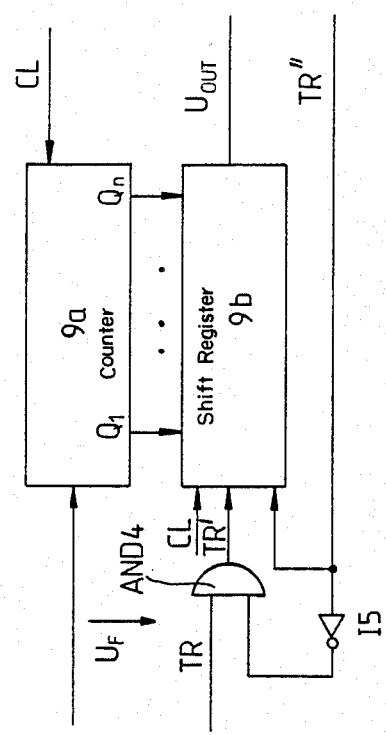
FIG. 4 is a variant solution of an impulse shaper.

A further embodiment of an impulse shaper 9 is represented in FIG. 4, which is adapted to reading off the content of the counter 9a by a computer through a shift register 9b. When the signal TR is in the state 1, the content of the counter 9a is transferred into the shift register 9b. Synchronously to the signal CL the content of the shift register 9b is transferred to the output OUT, whenever a signal TR from the computer is delivered to the register 9b.

Figure 5:
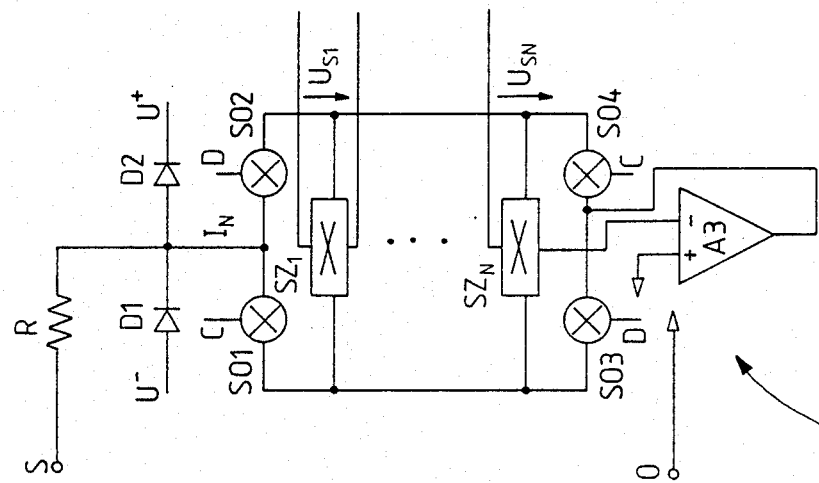
FIG. 5 is a variant solution of a sensor circuit.

When a higher consumption can be provided for the electronic circuit of the meter according to the invention, in the sensor circuit 1' an operational amplifier A3 is used (FIG. 5). Because of the amplifier A3, the Hall voltage terminal of the last sensor $SZ_N$ is at zero potential. Thus a voltage drop across the feeding part of the sensor is twice as high as in the basic embodiment, at the same time, however, the common voltage of both Hall terminals ("common mode" component) with respect to the ground of Hall voltages $U_{S1}$, ... $U_{SN}$ is strongly reduced. The reversing of the Hall voltage polarity is performed like in the basic embodiment by switching controlled switches SO1, ... SO4, which are interconnected to a bridge whose second input terminal is connected to the output of the amplifier A3.

Figure 6:
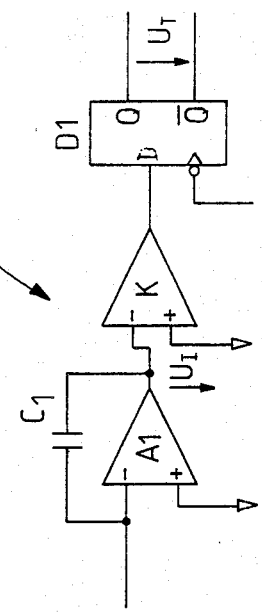
FIG. 6 is a block diagram of a delta modulator, which is a variant solution of an impulse-width modulator.

As an alternative to the impulse-width modulator 3 a delta modulator 3', shown in FIG. 6, can be applied. The modulator 3' is provided with a comparator K instead of the comparator circuit ST, switching at the zero level. The frequency of reversing the reference voltage polarity is increased by applying the modulator 3'; thereby the conversion accuracy is slightly reduced, the capacity, however, of the capacitor $C_1$ in the modulator 3' is far smaller than in the modulator 3. At the integrated meter circuit according to the invention this is an advantage since the capacitor $C_1$ takes up considerable space. In this embodiment the divider 6 is connected to the clock generator 10.

An advantage of the wattmeter according to the invention exists above all in that it makes possible the use of the Hall sensor for measurements of as high accuracy as it is required at electric wattmeters. A further advantage exists in that voltages of individual Hall elements are tapped separately, thus reducing the piezoresistive effect and the effect of the Hall element asymmetry as well as preventing the mutual disturbances present at parallel or series voltage tapping in known circuits. The wattmeter according to the invention is also advantageous in that the meter circuit occupies little space, its power consumption is low and the essential circuit parts are capable to be produced in CMOS technology on a single wafer.

What is claimed is:

1. Wattmeter including a Hall sensor circuit and an A/D converter, said Hall sensor including a plurality of Hall elements for producing a plurality of sensor voltages, said A/D converter comprising an impulse-width delta modulator, an impulse shaper, first and second frequency dividers with division ratios N and M, respectively, said frequency dividers connected to said impulse shaper, a compensation circuit for generating a compensation voltage, an adding circuit which receives said plurality of sensor voltages, a reference voltage, and said compensation voltage, a source for producing said reference voltage, said adding circuit producing an output signal fed to the input of said modulator, and a clock generator for generating clock pulse and first and second output signals, said modulator generating an output signal fed to the input of a counter forming part of the compensation circuit and also fed to the input of the impulse shaper, an inverted output of the modulator being connected to the input of the first frequency divider, the inverted output and a non-inverted output of the modulator being connected to first and second sets, respectively, of control terminals of adding circuit control switches in the adding circuit, and the sensor circuit includes a plurality of sensor switches being interconnected to a bridge with the sensor elements in a diagonal between two output terminals of each of said sensor elements, feeding terminals of said sensor elements being parallel-connected and a mains phase terminal being connected to a first input terminal of the bridge through a resistor, whereas a mains zero terminal of said sensor circuit being mass connected.

2. Wattmeter as recited in claim 1, wherein an output signal of the first frequency divider being conducted to the control terminals of a first pair of sensor switches corresponding to a first and a last Hall sensor element and the compliment of said output signal of said first frequency divider being conducted to the control terminals of a second pair of sensor switches corresponding to said first and last sensor elements.

3. Wattmeter as recited in claim 2, wherein a second input terminal of the bridge in the sensor circuit is mass-connected.

4. Wattmeter as recited in claim 2, and further including an operational amplifier in said sensor circuit and wherein the second input terminal of the bridge in the sensor circuit is connected to an inverting input of said operational amplifier, and a non-inverting input of said operational amplifier is mass-connected.

5. Wattmeter as recited in claim 3, wherein the output terminals of each Hall sensor element being connected to a first terminal of first and second sets of controlled switches, second terminals terminal of said controlled switches being interconnected and connected to capacitors.

6. Wattmeter as recited in claim 4, wherein the output terminals of the Hall sensor elements are connected to predetermined pairs of switches in each of said first and second sets of controlled switches, the second terminals of said switches being interconnected and connected to corresponding capacitors, a first output terminal of the last Hall sensor element being connected to a first terminal of a first set of two sets of a plurality of coupling switches and a second output terminal of the last Hall sensor element being connected to the inverting input of the operational amplifier, a second switch in said first set of coupling switches is mass-connected, second terminals of said first and second coupling switches being interconnected and connected to a capacitor.

7. Wattmeter as recited in claim 5 or 6, wherein the first and second sets of coupling switches are controlled by said first and second clock generator output signals, respectively.

8. Wattmeter as recited in claim 7, wherein the source of reference voltage is provided with a circuit for a precision curvature compensation CMOS bandgap reference, said circuit including an adjustable capacitor connected through a bridge of said first set of plurality of adding circuit controlled switches via a first pair of second stage adding circuit controlled switches, the voltage between the emitters of current mirror transistors of said reference voltage source being tapped to provide for a preset temperature dependent reference voltage, the emitters of said transistors being connected to said first set of a plurality of adding circuit control switches, said first set of switches being connected to a first pair of second stage adding circuit switches, the adding circuit switches being controlled by output signals of said modulator and the second stage adding circuit switches being controlled by the said first and second clock generator output signals.

9. Wattmeter as recited in claim 8, wherein the inverted output of the modulator is connected to the first input of an exclusive OR gate and the output of the first frequency divider is connected to the second input of the exclusive OR gate.

10. Wattmeter as recited in claim 9, wherein the output of the exclusive OR gate is connected to the input of a counter of said impulse shaper, first and second outputs of said counter being connected to the inputs of a first AND gate, and the second output of said counter being connected to a first input of a second AND gate and the first output of said counter being connected to a second input of the second AND gate through an inverter, the output of the first frequency divider being connected to the input of the second frequency divider and the output of said second frequency divider being connected to the clock input of a flip-flop of said impulse shaper, a reset input of said flip-flop receiving inverted clock impulses from said clock generator, a data input of said flip-flop receiving a feeding voltage from said sensor circuit, an output signal of a first memory cell in said impulse shaper being conducted to an input of a third frequency divider in said impulse shaper, and an output of said flip-flop being conducted to the input of the third frequency divider, the output of said flip-flop is conducted to an input of a fourth frequency divider in said impulse shaper and the output of the first memory cell being conducted to the input of the fourth frequency divider, the outputs of the third and fourth frequency dividers being connected to reset and set inputs, respectively, of second memory cell, the output of the second memory cell being connected to a first input of a third AND gate, a second input of the third AND gate receiving the output of the first memory cell, and whereby an output of the third AND gate corresponds to meter output impulses.

11. Wattmeter as recited in claim 9, wherein said impulse shaper comprises a shift register and a counter, said counter a counter having a first input connected to the output of the exclusive OR gate, and a second input receiving said clock generator clock impulses, and outputs of said counter being connected to corresponding inputs of said shift register, a first control terminal of said shift register receiving a first control signal from a digital computer, said first control signal also being conducted through an inverter to a first input of a fourth AND gate, a second input of said fourth AND gate receiving an output of a memory cell in said compensation circuit, and an output of the fourth AND gate being connected to a second control terminal of the shift register, whereby an output of said shift register corresponds to a meter output signal.

12. Wattmeter as recited in claim 10 or 11, wherein the compensation circuit comprises an up/down counter, a latch register, and first and second flip-flop circuits, an input of said up/down counter receiving the output of said first flip-flop, predetermined ones of outputs of the up/down counter being connected to the first inputs of a plurality of exclusive OR gates, whereas a final output of the up/down counter being connected to all other inputs of the exclusive OR gates, the outputs of the exclusive OR gates being connected to the inputs of said latch register, said latch register being controlled by the second flip-flop to accept the content of the up/down counter, whereas to the reset input of the second flip-flop the inverse of the clock generator impulse signal is conducted, to the data of said second flip-flop input the feeding voltage is conducted and the third input of the second flip-flop being connected to the first frequency divider output signal, the outputs of the latch register being connected to control terminals of switches in a D/A converter in said compensation circuit for tapping a compensation reference voltage from a voltage source in said compensation circuit.

13. Wattmeter as recited in claim 12, and further comprising a resistor being mass-connected at one terminal and connected at the other terminal to a positive current source and, through said first set of controlled switches of said sensor elements, the control terminal of said first set of switches being connected to the final output of the up/down counter of said compensation circuit through an inverter and, said resistor being directly connected to a first control switch in said compensation circuit, said switch being controlled by the first clock generator output signal and said resistor being further connected via a second control switch, controlled by the second clock generator output signal to said D/A converter in said compensation circuit.

* * * * *